United States Patent [19]
Chiba et al.

[11] Patent Number: 5,846,676
[45] Date of Patent: Dec. 8, 1998

[54] MASK STRUCTURE AND EXPOSURE METHOD AND APPARATUS USING THE SAME

[75] Inventors: Keiko Chiba, Utsunomiya; Takayuki Yagi, Yokohama, both of Japan

[73] Assignee: Canon Kabushiki Kaisha, Tokyo, Japan

[21] Appl. No.: 710,979

[22] Filed: Sep. 25, 1996

[30] Foreign Application Priority Data

Sep. 26, 1995 [JP] Japan ................................. 7-247346

[51] Int. Cl.⁶ ........................................................ G03F 9/00
[52] U.S. Cl. ................................................. 430/5; 378/35
[58] Field of Search ......................... 430/5, 322; 378/34, 378/35

[56] References Cited

U.S. PATENT DOCUMENTS

| | | | |
|---|---|---|---|
| 4,735,877 | 4/1988 | Kato et al. | 430/5 |
| 5,413,664 | 5/1995 | Yagi et al. | 156/345 |
| 5,422,921 | 6/1995 | Chiba | 378/34 |
| 5,553,110 | 9/1996 | Sentoku et al. | 378/35 |
| 5,589,304 | 12/1996 | Chiba et al. | 430/5 |

FOREIGN PATENT DOCUMENTS

| | | |
|---|---|---|
| 62-14132 | 1/1987 | Japan . |
| 4-66096 | 10/1992 | Japan . |
| 60-186840 | 9/1995 | Japan . |

*Primary Examiner*—S. Rosasco
*Attorney, Agent, or Firm*—Fitzpatrick, Cella, Harper & Scinto

[57] ABSTRACT

An X-ray mask structure is produced by a procedure including the steps of preparing a substrate having a surface provided thereon with an X-ray transmitting film, forming, on the substrate, one of a metal film and a multilayered film, having alkali resistivity, removing a predetermined limited portion of the metal film, bonding the substrate and a reinforcing member through the remaining metal film, by an anodic bonding process wherein the remaining metal film functions as an electrically conductive material in the anodic bonding process, etching the substrate with the remaining metal film functioning as an etching mask, to define an X-ray transmitting portion of the X-ray transmitting film and forming a mask pattern by use of an X-ray absorptive material.

10 Claims, 9 Drawing Sheets

MASK STRUCTURE AND EXPOSURE METHOD AND APPARATUS USING THE SAME

FIELD OF THE INVENTION AND RELATED ART

This invention relates to an exposure mask structure and a method of manufacturing the same, and to an exposure method and apparatus using the mask structure. Also, the invention is concerned with a semiconductor device manufacturing method using such a mask structure.

Pattern linewidths of a semiconductor integrated circuit have been decreased to meet the need for higher density and speed of the circuit. Also, higher performance has been required of the manufacturing procedure thereof. In consideration of this, printing apparatuses (steppers) using light having an X-ray region (2–150 Angstroms) an exposure wavelength have been developed.

Figure 8:
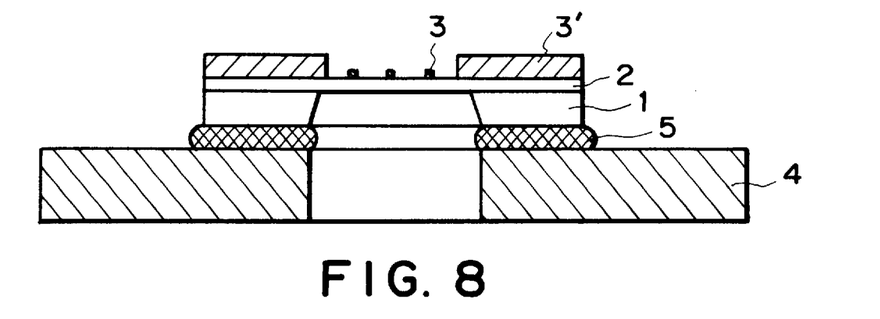
FIG. 8 is a schematic view for explaining, in section, a known example of an X-ray mask structure.

FIG. 8 is a sectional view schematically showing an X-ray mask structure of a known type for use in such X-ray lithography processing. The X-ray mask structure comprises an X-ray absorptive material 3, an X-ray blocking layer 3', a supporting film 2 for supporting the absorptive material 3, a holding frame 1 for holding the supporting film 2, and a reinforcing member 4 for reinforcing the holding frame 1. For adhesion between the holding frame 1 and the reinforcing member 4, mainly an adhesive agent 5 an organic series is used. In this case, contraction of the adhesive material through setting causes a change in the force applied to the holding frame 1. finally, it influences the X-ray absorptive material 3. It is therefore difficult to maintain high positioning precision of the X-ray absorptive material 3.

Bonding processes without using an adhesive material have been proposed, such as an anode bonding method or a direct bonding method using a Si material for the reinforcing member 4. In such a bonding process, the reinforcing member 4 may first be bonded to a Si substrate (to serve as the holding frame 1) and thereafter, a different process may be performed However, since formation of the supporting film 2 is usually based on a CVD process and uses a temperature near 1000° C., the material for the reinforcing member or the bonding process is restricted. Practically, a possible method may only be to use the direct bonding process wherein Si is used for the reinforcing member 4 and a temperature not lower than 1000° C. is used. However, processing Si is not easy and, therefore, practically, it is difficult to use Si as a reinforcing member 4.

In consideration of these problems, attempts have been made to use a method in which a supporting film 2 is formed on a holding frame (Si substrate) 1, and is bonded to a reinforcing member 4 or a method in which a supporting film 2 is formed on a Si substrate and the Si substrate is then etched to shape the holding frame, which is in turn bonded to a reinforcing member 4. However, for increasing contact area between the holding frame 1 and the reinforcing member 4, the bonding surfaces should be polished precisely and, additionally, pressure has to be applied to both of the substrates. Therefore, if the Si substrate is etched before bonding, the mask portion comprising the supporting film 2 becomes very fragile and application of pressure easily causes breakage of that portion.

From these points, for manufacturing of an X-ray mask to be used in an X-ray exposure apparatus (which is a printing apparatus for high-density semiconductor integrated circuits), the best way may be to form a supporting film 2 upon a Si substrate (to serve as a holding frame 1) and, after bonding it to a reinforcing member 4, to etch the Si substrate to shape the holding frame 1.

This process, however, involves the following difficulties.

Figures 9A, 9B:
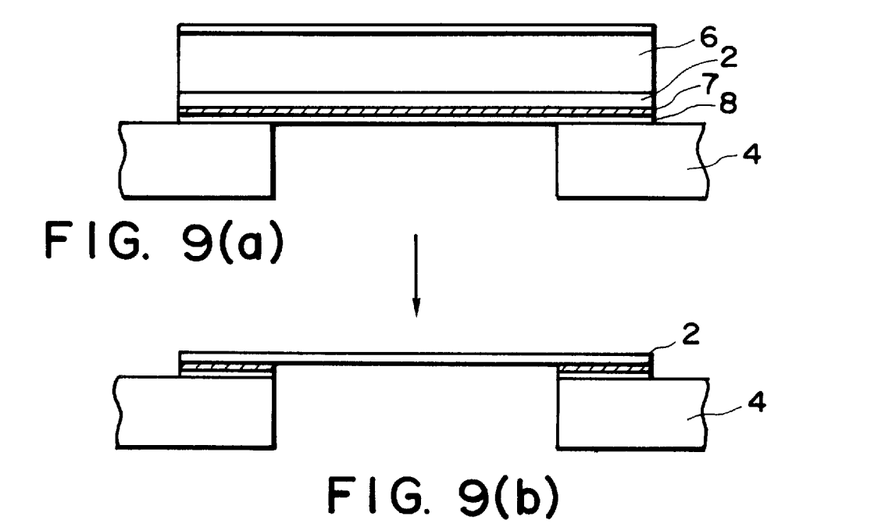
FIGS. 9(a) and 9(b) are schematic views for explaining, in section, a known example of X-ray mask structure manufacturing processes.

Japanese Laid-Open Patent-Application, Laid-Open No. 14132/1987 and Japanese Published Patent Application, Publication No. 66096/1992 show a procedure in which, as shown in FIGS. 9(a) and 9(b), an Si substrate 6 is formed with a supporting film 2 made of BN, for example, a Cr film 7 and Al film 8, for example, wherein a reinforcing member 4 made of Pyrex glass (trade name) is bonded to the Al film 8 side of the Si substrate 6 (FIG. 9(a). The Si substrate 6 is then etched from the side opposite to the surface where the reinforcing member 4 is bonded (FIG. 9, (b)). With this method, since a cut bore of the reinforcing member 4 defines an X-ray transmitting portion controlling, the precision of the shape has to rely on the machining of the reinforcing member 4.

Here, for an ordinary step-and-repeat exposure process, it is necessary to provide an X-ray blocking layer 3' such as shown in FIG. 8 for prevention of superposed or multiple exposures. This layer should have a large thickness as compared with the X-ray absorptive material 3. Making these layers involves many problems such as positional deviation of a pattern due to a stress of the blocking layer itself or thermal distortion due Lo absorption of X-rays during the exposure process. From this point of view, forming the X-ray blocking layer 3' with a Si substrate may be the most desirable. Then, to reduce spacing of the step-and-repeat motion to enhance the yield, it is necessary to control the Si substrate etching shape very precisely.

Figures 10A, 10B:
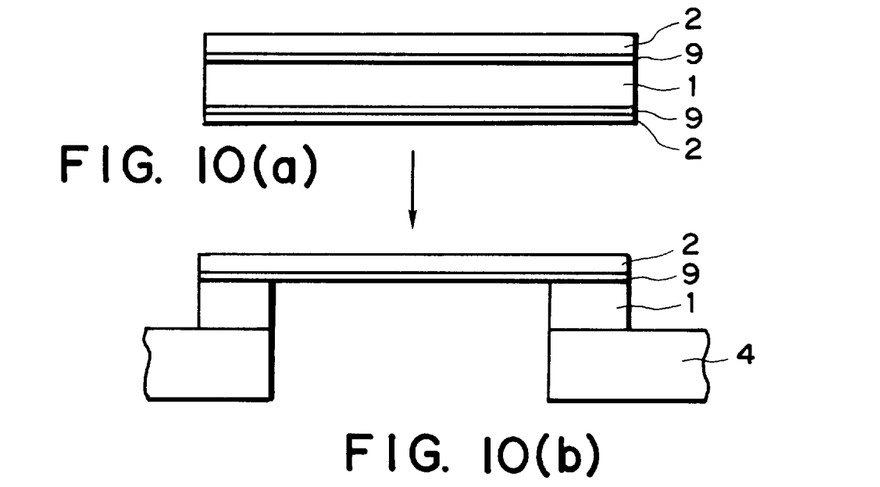
FIGS. 10(a) and 10(b) are schematic views for explaining, in section, another known example of X-ray mask structure manufacturing processes.

Japanese Published Patent Application, Publication No. 66096/1992 shows a method in which, as shown in FIGS. 10(a) and 10(b), a Si substrate 1 is formed, on its opposite faces, with a $SiO_2$ film 9 and a BN film 2 (FIG. 10(a)), and a reinforcing member 4 made of Pyrex glass, for example, is directly bonded to the Si substrate 1. The Si substrate 1 is then etched while using the reinforcing member 4 as a masking, to shape a holding frame 1 (FIG. 10(b)). With this method, like the method described with reference to FIGS. 9(a) and 9(b), controlling the precision of the shape has to rely on the machining of the reinforcing member 4.

Figure 11A:
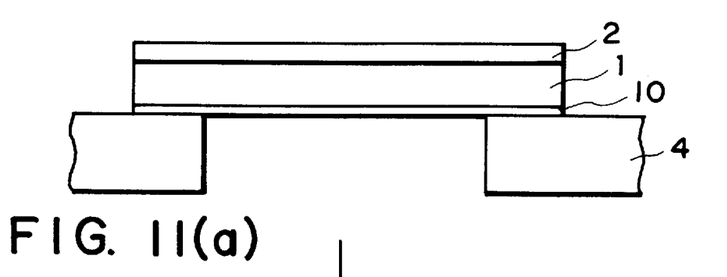
FIGS. 11(a) and 11(b) are schematic views for explaining, in section, a further known example of X-ray mask structure manufacturing processes.
Figure 11B:
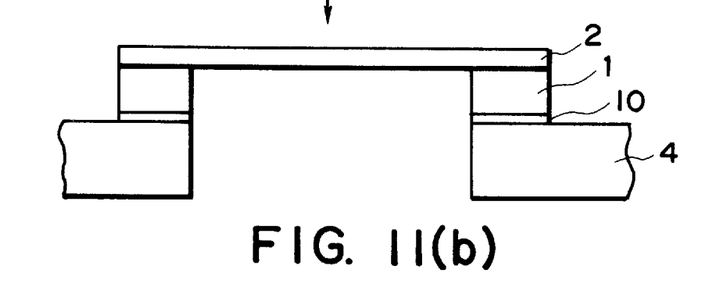

Japanese Published Patent Application, Publication No. 66096/1992 further shows a method in which, as shown in FIGS. 11(a) and 11(b), a BN film 10 of the same material as a supporting film 2 on a,Si substrate 1 and a reinforcing member 4 made of Pyrex glass for example are bonded to each other through anode bonding (FIG. 11(a)), and then, the BN film 10 and the Si substrate 1 are etched (FIG. 11(b). However, anode bonding to glass and BN, not containing an electrically conductive material, is difficult to accomplish and, therefore, is not an easy method.

Figure 12A:
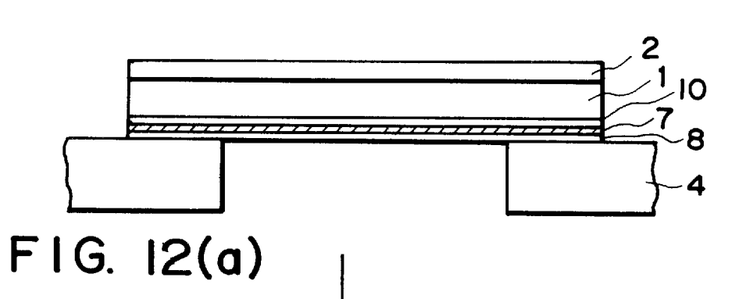
FIGS. 12(a) and 12(b) are schematic views for explaining, in section, a further known example of X-ray mask structure manufacturing processes.
Figure 12B:
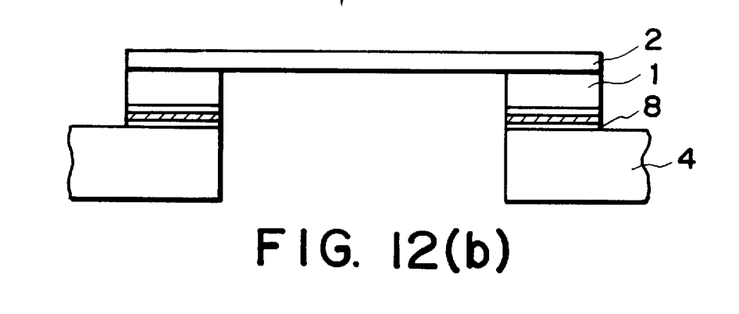

Japanese Published Patent Application, Publication No. 66096/1992 further shows a method in which, as shown in FIGS. 12(a) and 12(b), a Si substrate 1 is formed with a supporting film 2 made of BN, a BN film 10, a Cr (or Ti) film 7 and and Al film 8, and in which a reinforcing member 4 is anode bonded to the Al film 8 side of the Si substrate 1 (FIG. 12(a)), the Si substrate being then etched (FIG. 12(b)). The etching of the Si substrate is based on isotropic etching using a mixture of hydrofluoric acid, nitric acid and acetic acid. For this reason, the amount of side etching of the Si substrate is difficult to control, and it results in a difficulty in controlling the shape of the X-ray transmitting portion. If aeolotropic etching is used for easy shape control, since it is based on the use of a strong alkali such as 30 wt % KOH, for example, a metal having a low alkali resistivity such as Al is etched together with Si, such that the bonding cannot be performed properly.

SUMMARY OF THE INVENTION

It is an object of the present invention to provide a solution for at least one of the problems described above and, specifically, to provide a mask structure in which a holding frame may be used as a blocking layer and in which a reinforcing member and the holding frame are bonded tightly to assure high positioning precision.

It is another object of the present invention to provide a method of manufacturing of a mask structure by which tight bonding between a reinforcing member and a holding frame is stably assured, by which high positional precision is attained and by which good yield is enabled.

It is a further object of the present invention to provide a high precision exposure method and apparatus by which the spacing the step-and-repeat spacing can be reduced and by which good yield is assured.

It is yet a further object of the present invention to provide a method by which a high performance device can be manufactured with good yield.

A mask structure according to one aspect of the present invention comprises a radiation absorptive material, a supporting film for supporting the absorptive material, a holding frame for holding the supporting film, and a reinforcing member for reinforcing the holding frame, wherein the holding frame and the reinforcing member may be bonded to each other through a metal film or a multilayered metal film having alkali resistivity (and an amorphous insulative material containing moving ions).

An exposure method, an exposure apparatus and a device manufacturing method according to the present invention may use a mask structure as described above.

The supporting film, absorptive material, holding frame and reinforcing member usable in the present invention may be chosen from various elements having been used in radiation (X-ray) structures. As regards an X-ray supporting film, from the viewpoint of sufficient transmissivity to X-rays and self-standing, the thickness of the X-ray supporting film may preferably be in a range of 1–10 microns. Preferable examples are an inorganic film of Si, $SiO_2$, SiC, SiCN, BN or AlN, for example; a radiation resistive organic film such as polyimide; and a single composite film of any of them As regards the X-ray absorptive material, from the viewpoint of sufficient X-ray absorptiveness and easy machining, the thickness may preferably be in a range of 0.2–1.0 micron, and the use of a heavy metal such as Au, W, Ta or Pt, for example, or a composite of any of them may be preferable. As regards the supporting frame, a silicon wafer may be preferable. As regards the reinforcing member, the use of a glass material such as Pyrex or silica glass, for example, or ceramics may be preferable. Particularly, a material having a Young's modulus not less than 50 Gpa and a linear expansion coefficient not greater than $1 \times 10^{-5} K^{-1}$ may be preferable. The reinforcing member may be shaped to be suited to conveyance or chucking, and its surface to be bonded may desirably be polished to a flat s ness of 1 micron or less. An X-ray mask structure of the present invention may be provided with additional elements such as a protection film for an X-ray absorptive material, a conductive film or an anti-reflection film for alignment light, for example.

In an X-ray mask structure according to the present invention, a holding frame and a reinforcing member may be bonded to each other through a metal film or a multilayered metal film having alkali resistivity (and through an amorphous insulative material containing moving ions). The bonding via a metal film or a multilayered metal film corresponds to one or both of the surfaces of the holding frame and the reinforcing member, to be bonded (if an amorphous insulative material is formed, then the surface thereof), are in contact with the metal film or multilayered metal film and are attributable to the bonding stiffness. Having alkali resistivity corresponds to passivation of a metal film being insoluble to an alkali liquid. For example, a metal film having alkali resistivity being insoluble when dipped in 30 wt % KOH (frequently used in aeolotropic etching) in a day and night, may be preferable.

Preferable examples of a metal film having alkali resistivity may be Ti and Ni, which may be anode bonded with glass.

A multilayered metal film having alkali resistivity may preferably comprise an accumulation of, from the holding frame side, (1) an underlying layer having alkali resistivity and providing good adherence to the holding frame, (2) a metal layer having alkali resistivity, and (3) a metal junction layer having alkali resistivity. Preferable examples of the material of such an underlying layer (1) may be Ti and Cr. Preferable examples of the material of such a metal layer (2) may be noble metals such as Au, Cu and Pt, for example, with small stress. Preferable examples of the material of such a metal junction layer (3) may be Ti and Ni, providing good adhesion to the holding frame. When a multilayered metal film with alkali resistivity, including an intermediate layer made of a small stress metal, is used, the stress level of the film itself becomes small and the stability improves.

An X-ray mask structure manufacturing method according to the present invention may comprise forming a supporting film (e.g., an X-ray transmission film) upon a Si substrate, to be formed into a holding frame. When a CVD method is used for formation of the supporting film, it may be formed on both surfaces. When a sputtering process is used, it may be formed on a single surface. When supporting films are formed on both surfaces, the film on one surface may be left there or removed from there. Subsequently, a metal film or a multilayered metal film having alkali resistivity may be formed on the Si substrate, to be formed into a holding frame. Then, a resist may be applied to this metal film or multilayered metal film and, through a dry etching or wet etching process, an X-ray transmitting portion is formed. When the supporting film is left between the metal film (or the multilayered metal film) and the Si substrate, the supporting film may be etched, uninterruptedly When a metal such as Ni, Cr or Cu, for example, that can be provided by plating, is used, the film formation may be made, by plating, to the surface on the side opposite to the surface to be used as the supporting film, after formation of the resist pattern at the X-ray transmitting portion.

Subsequently, via the metal film or the multilayered metal film, the Si substrate and the reinforcing member may be bonded to each other. When an amorphous insulative material such as Pyrex glass, for example, containing moving ions, is used as the reinforcing member, pressure may be simply applied to both of the components for intimate contact. A voltage of several hundred volts and a temperature of 200°–400° C., for example, may be applied to perform anode bonding. If, on the other hand, ceramics are used as the reinforcing member, an amorphous insulative material containing moving ions may be deposited by evaporation upon the surface of the reinforcing member and anode bonding may he done thereafter. While the voltage to be applied may vary with the thickness or material of the substrate, a few tens of volts to a few kilovolts, preferably, a few tens of volts to one kilovolt, may be applied. The temperature may normally be in a range of 200°–400° C. Using LB film (e.g., monomolecular built-up film) or light may enable bonding at a lower or normal temperature.

After bonding the reinforcing member and the Si substrate (to be formed into a holding frame), an aeolotropic etching process may be performed by using a strong alkali such as KOH, for example, by which a holding frame which may serve also as an X-ray blocking layer may be shaped. The X-ray blocking layer may be provided by both of the absorptive material and the holding frame. If the reinforcing member is made of a material of low resistivity to alkali, taking into account the balance between the alkali resistivity and the precision required of the reinforcing member, an etching protection film may he formed. For example, although a glass such as Pyrex glass may be etched by a few millimeters to a few tens of millimeters, if it does not raise a problem in the precision of the reinforcing member or if the reinforcing member has been machined while taking into account the reduction by etching, it may not be necessary to form a protection film. If precision is required, a protection film may be made by using an apiesone wax or ceramics such as SiN, for example.

Subsequently, an absorptive material may be formed on the supporting film, whereby an X-ray mask structure may be provided. Although the formation of the absorptive material may be made after the formation of the supporting film, it may be determined while taking into account the balance between the temperature stability of the absorptive material and the complicity of the process.

An X-ray exposure method and an X-ray exposure apparatus according to the present invention may be adapted to perform an X-ray exposure process to a member to be exposed (a member to which a pattern is to be transferred) by using an X-ray mask as described above, by which an X-ray absorptive material pattern, for example, may be transferred to that member. A device manufacturing method according to the present invention may use such an X-ray mask structure to perform an X-ray exposure process to a workpiece by which an X-ray absorptive material pattern may be transferred and printed onto the workpiece. Except for using an X-ray mask structure according to the present inventions as described above, measures or processes known in the art may be used without specific limitation.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will be explained with reference to the drawings.

[Embodiment 1]

An X-ray mask structure of the present invention was made in accordance with the processes depicted in FIGS. 1(a) through 1(f)

Figure 1A:
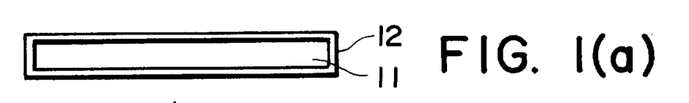
FIGS. 1(a) through 1(g) are schematic views for explaining, in section, X-ray mask structure manufacturing processes according to first and second embodiments of the present invention.
Figure 1B:
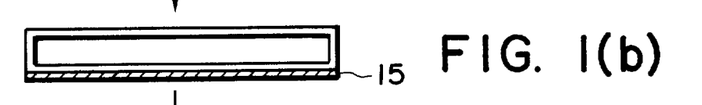
Figure 1C:
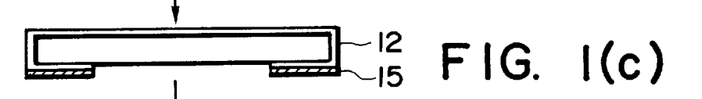
Figure 1D:
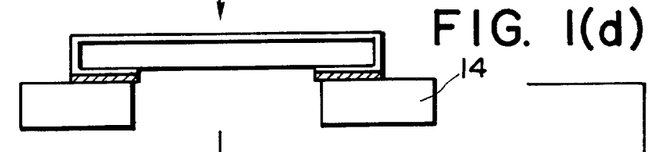

First, as shown in FIG. 1(a), upon the opposite surfaces of a Si substrate 11 to be finally formed into a holding frame, a SiC film of 2.0 micron thickness (to provide a supporting film 12 having X-ray transmissibility) was formed through a CVD process. Then, as shown in FIG. 1(b), by EB vapor deposition, a Ti film of 0.2 micron (to provide a metal film 15 with alkali resistivity) was formed. on one of the surfaces. Subsequently, on the Ti film 15, a resist layer with a patterned X-ray transmitting portion was formed (not shown). Then, as shown in FIG. 1(c), the Ti film 15 was etched with a $CF_4$ gas and the SiC film was etched with a $SF_6$ gas, by which the resist was removed. Thereafter, as shown in FIG. 1(d), a voltage of 200 V and a temperature of 350° C. were applied, and the Ti film 15 and a reinforcing member 14 were anode bonded to each other. Here, the reinforcing member 14 is a frame member having an opening to be used as an X-ray transmitting portion and, in this embodiment, Pyrex glass was used. The outside peripheral shape of the reinforcing member 14 may be circular or square. The central opening of it may be circular or square, provided that it provides a sufficient region to the transmission of X-rays. While not illustrated in the drawing, the reinforcing member was machined to be suited to conveyance or chucking.

Figure 1E:
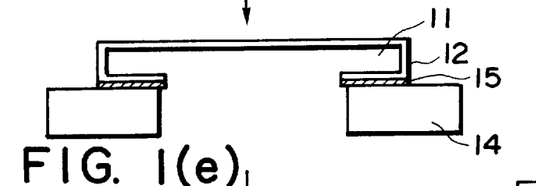

Subsequently, as shown in FIG. 1(e), the Ti film 15 and the SiC film 12 thus patterned were used as an etching mask, and the Si substrate 11 was etched by using 30 wt % KOH, whereby a holding frame 11 having a precisely controlled X-ray transmitting portion was prepared. An etching protection film may be or may not be provided on the Pyrex glass 14.

Figure 1F:
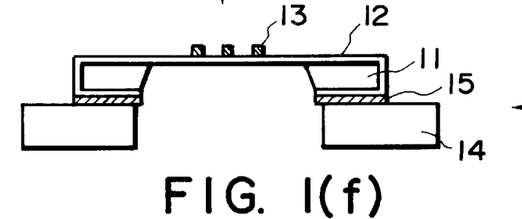

Subsequently, after plating electrodes were formed, the resist was shaped by using an EB patterning apparatus into a desired shape. An Au film was formed with a thickness of 0.4 micron Then, the resist and the plating electrodes were removed, whereby an X-ray absorptive material pattern 13 of Au such as shown in FIG. 1(f), was provided.

In this embodiment, the metal film (Ti film) 15 having alkali resistivity can be used as an etching mask during the etching process for the Si substrate, for formation of the X-ray transmitting portion. Also, it can be used as a n electrically conductive material in the anode bonding. As a result, the holding frame can be used as an X-ray blocking layer and, additionally, stiff bonding can be stably attained. Thus, the present embodiment achieves stable and high yield production of an X-ray mask structure having high position precision.

Since, in this embodiment, the X-ray absorptive material 13 is formed at the last stage, there occurs no stress change due to temperature, and also, this is effective to maintain high position precision of the X-ray absorptive material 13.

[Embodiment 2]

Another X-ray mask structure of the present invention was made in accordance with the processes illustrated in FIGS. 1(a) through 1(d), 1(g) and 1(f).

Figure 1G:
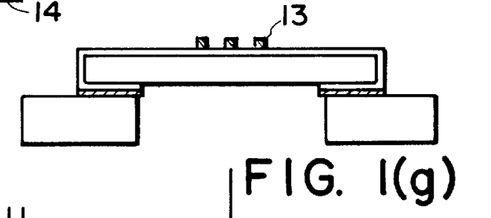

In the processes from FIGS. 1(a) to 1(d), the same procedure was adopted. Then, as shown in FIG. 1(g), a film of W (to provide an X-ray absorptive material 13) was formed by sputtering with a thickness of 0.7 micron. Then, through EB patterning, a desired pattern was formed and, by using a $SF_6$ gas, the W film was etched, by which an absorptive material 13 was formed. Subsequently, as shown in FIG. 1(f), the Si substrate 11 was etched by using 30 wt % KOH.

In this embodiment, the X-ray absorptive material 13 wherein no stress change occurs with etching temperature was formed before the etching of Si. This assured high position precision of the X-ray absorptive material without using a complicated process.

[Embodiment 3]

Another X-ray mask structure of the present invention was made in accordance with the processes shown in FIGS. 1(a) through 1(c), and in FIGS. 2(h) through 2(k).

Figure 2H:
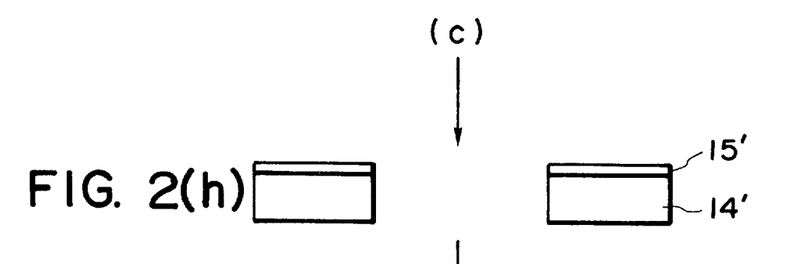
FIGS. 2(h) through 2(k) are schematic views for explaining, X-ray mask structure manufacturing processes according to a third embodiment of the present invention.
Figure 2I:
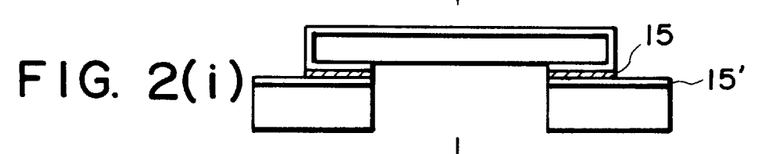
Figure 2J:
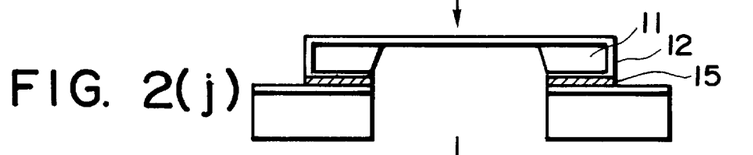
Figure 2K:
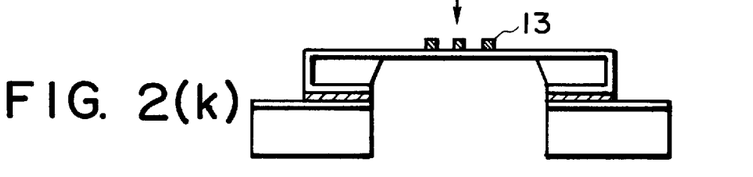

In the processes shown in FIGS. 1(a) through 1(c), the same procedure was adopted. Then, as shown in FIG. 1(h), upon a reinforcing member 14' made of SiC, a film 15 ' of glass material containing moving ions, such as a glass (Corning, #7740) containing $Na^+$, was formed through sputtering. Subsequently, as shown in FIG. 2(i), a voltage of 1 KV and a temperature of 250° C. were applied to glass film 15' and Ti film 15 to perform a niode bonding of them. Then, as shown in FIG. 2(j), while using the patterned Ti film 15 and SiC film 12 as an etching mask, the Si substrate 11 was etched by using 30 wt % KOH, whereby a holding frame 1 having a precisely controlled X-ray transmitting portion was formed. While not shown in the drawings, an etching protection film was formed on the glass film 15' by using apiesone wax, for example, and it was removed after comupletion of the etching. Subsequently, as shown it FIG. 2(k), after the plating electrodes were formed, the resist was patterned by EB patterning into a desired pattern. A film of Au was formed with a thickness of 0.4 micron, and the resist and the plating electrodes were removed, by which an X-ray absorptive material pattern 13 was formed.

In this embodiment, ceramics (SiC) were used for the reinforcing member 14. This effectively improves the rigidity and increases the stability of the position precision of the X-ray mask.

[Embodiment 4]

An X-ray mask structure of the present invention was made in accordance with the processes shown in FIGS. 3(a) through 3(f).

Figure 3A:
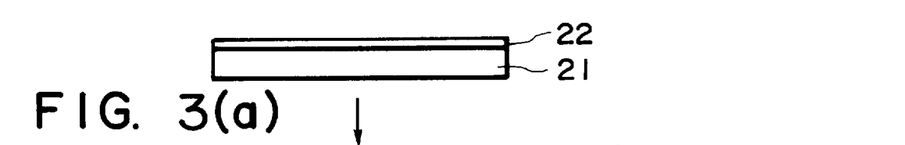
FIGS. 3(a) through 3(f) are schematic views for explaining, in section, X-ray mask structure manufacturing processes according to a fourth embodiment of the present invention.
Figure 3B:
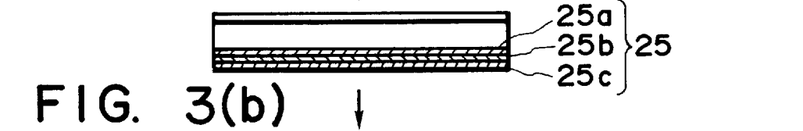
Figure 3C:
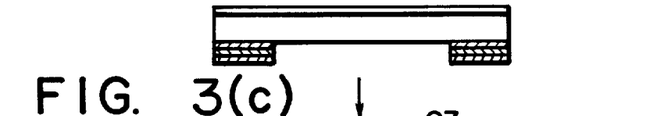
Figure 3D:
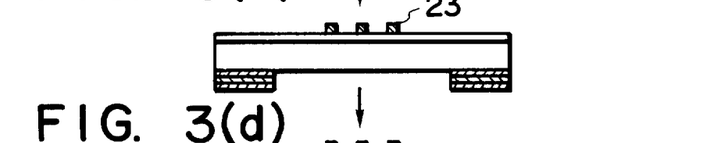
Figure 3E:
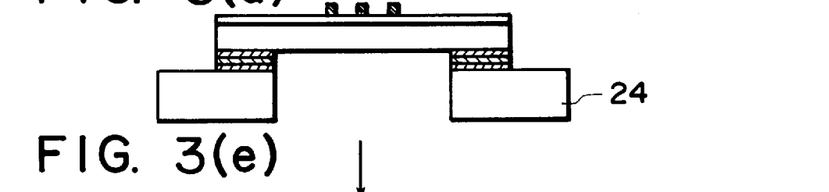
Figure 3F:
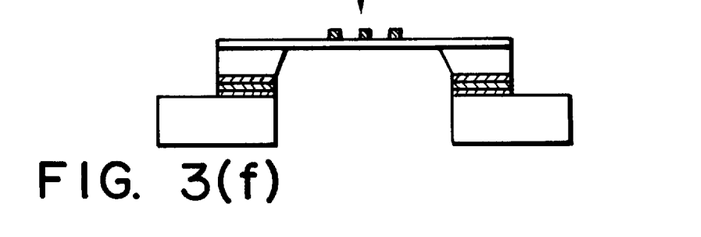

First, as shown in FIG. 3(a), upon a single surface of Si substrate 21 to be finally formed into a holding frame, a SiN film (to provide a supporting film with X-ray transmissibility) was formed with a thickness of 2.0 micron, through sputtering. Then, as shown in FIG. 3(b), by EB vapor deposition, Ti of 0.05 micron for an underlying layer 25a having alkali resistivity and providing good adhesion to the substrate, Au of 0.2 micron for a metal layer 25b having alkali resistivity and small stress, and Ti of 0.05 micron for a metal junction layer 25c having alkali resistivity, were deposited continuously. These three layers provided an etching mask 25 for the formation of an X-ray transmitting portion. Subsequently, while not shown in the drawing, a resist layer patterned for the X-ray transmitting portion was formed. Then, as shown in FIG. 3(c), Ti films 25a and 25c were dry-etched by using $CF_4$ gas and also, Au film 25b was dry-etched by using $CCl_2F_2$ gas, continuously, and the resist was removed. Subsequently, as shown in FIG. 3(d), a Ta film for providing an X-ray absorptive material 23 was formed with a thickness of 0.8 micron, by sputtering. Thereafter, a desired pattern was formed by EB patterning. A gas of $CBrF_3$ was used to etch the Ta film, whereby an X-ray absorptive material 23 was formed. Reinforcing member 24 comprises a frame member having an opening for an X-ray transmitting portion, and in this embodiment Pyrex glass was used. Like the third embodiment, a reinforcing member of ceramics with deposition of a glass containing moving ions may be used. Subsequently, as shown in FIG. 3(e). the reinforcing member 24 and the multilayered metal film 25 were anode bonded to each other with the application of a voltage of 700 V and a temperature of 300° C. Then, as shown in FIG. 3(f), while using the patterned multilayer metal film 25 as an etching mask, the Si substrate 11 was etched by 30 wt % KOH, whereby a holding frame 21 having a precisely controlled X-ray transmitting portion was provided. An etching protection film may be or may not be formed on the Pyrex glass of reinforcing member 24.

In this embodiment, a multilayered metal film, with alkali resistivity and having an intermediate layer made of a small stress metal, is used. As a result, the stress level of the film itself becomes small, and further enhancement of the stability is assured.

[Embodiment 5]

An X-ray mask structure of the present invention was made in accordance with the processes shown in FIGS. 4(a) through 4(g).

Figure 4A:
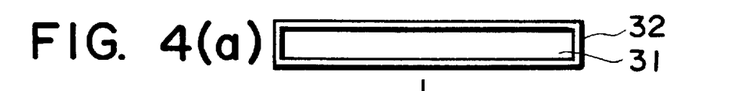
FIGS. 4(a) through 4(g) are schematic views for explaining, in section, X-ray mask structure manufacturing processes according to a fifth embodiment of the present invention.
Figure 4B:
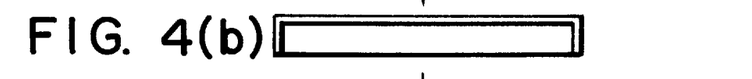
Figure 4C:
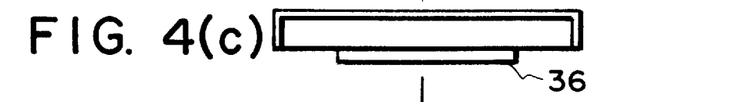
Figure 4D:
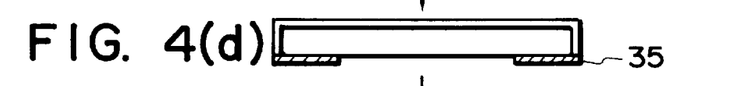
Figure 4E:
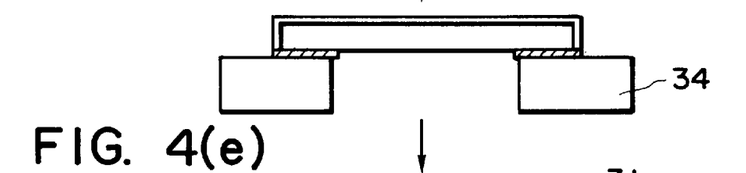

First, as shown in FIG. 4(a), upon the opposite surfaces of a Si substrate 31 to be finally formed into a holding frame, a SiN film of 2 micron thickness (for providing a supporting film 32 having X-ray transmissibility) was formed by CVD. Then, as shown in FIG. 4(b), the SiN film at one of the surfaces was removed by using heated phosphoric acid. Then, as shown in FIGS. 4(c), a resist 36 with a patterned X-ray transmitting portion was formed. Then, as shown in FIG. 4(d), a Ni film of 0.2 micron (for providing a metal film 35 with alkali resistivity) was formed through plating, and the resist was removed. Subsequently, as shown in FIG. 4(e), an alternate current (frequency 10 KHz, 50 Vp-p) was applied at a temperature of 350° C. to a reinforcing member 34 and the metal film 35, whereby they were anode bonded. The reinforcing member 34 comprises a frame member having an opening for an X-ray transmitting portion, and in this embodiment Pyrex glass was used. Like the third embodiment, a reinforcing member of ceramics with deposition of a glass containing moving ions may be used.

Figures 4F, 4G:
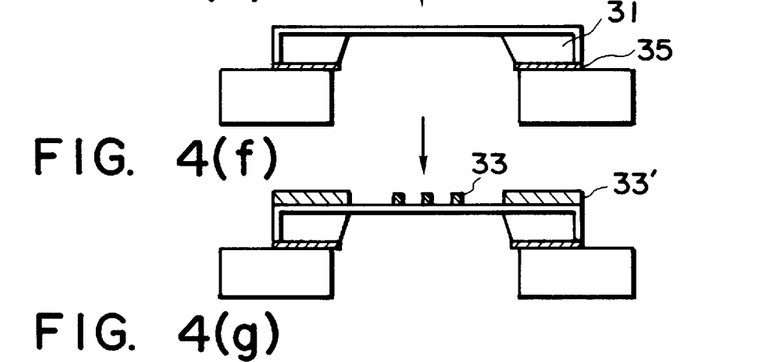

Subsequently, as shown in FIG. 4(f), while the Ni film 35 was used as an etching mask, the Si substrate 31 was etched by 30 wt % KOH, whereby a holding frame 31 having a precisely controlled X-ray transmitting portion was provided. An etching protection film may be or may not be provided on the Pyrex glass reinforcing member 34. Then, as shown in FIG. 4(g), after plating electrodes were formed, the resist was patterned by EB patterning into a desired shape. An Au film of 0.7 micron was formed. The resist and the plating electrodes were removed, whereby an X-ray absorptive material pattern. 33 and an X-ray blocking layer 33' were provided.

In this embodiment, the metal film is formed through plating. This enables the formation of a small stress film with a simpler operation.

In the mask structure described above, since the absorptive material and the holding frame provide an X-ray blocking layer, higher precision control is assured to the absorptive material. Also, The holding frame which can serve also as a substrate therefor can be formed with good precision. Thus, an X-ray blocking layer of higher precision, free from distortion due to stress or heat absorption of the absorptive material, is provided. Therefore, when such an X-ray mask is used in an X-ray exposure apparatus, the step-and-repeat spacing can be reduced and the yield of exposure can be improved.

[Embodiment 6]

An X-ray mask structure was made in a similar manner as in the fifth embodiment, except that: the multilayered metal film 35 of the fifth embodiment was replaced by a multilayered film wherein a Cr layer of 0.05 micron (for an underlying layer having alkali resistivity and providing good adhesion to the substrate), a Cu layer of 0.2 micron (for a metal layer of small stress and having alkali resistivity) and a Ni layer of 0.05 micron (for a metal junction layer with alkali resistivity) were formed by continuous plating.

This embodiment uses a multilayered film as is in the fourth embodiment, and the stress level of the film itself becomes small and the stability is enhanced.

[Embodiment 7]

Now, an embodiment of are exposure apparatus for the manufacture of microdevices such as semiconductor devices, thin film magnetic heads or micro-machines, for example, using an X-ray mask structure according to any one of the first to sixth embodiments described above, will be explained.

Figure 5:
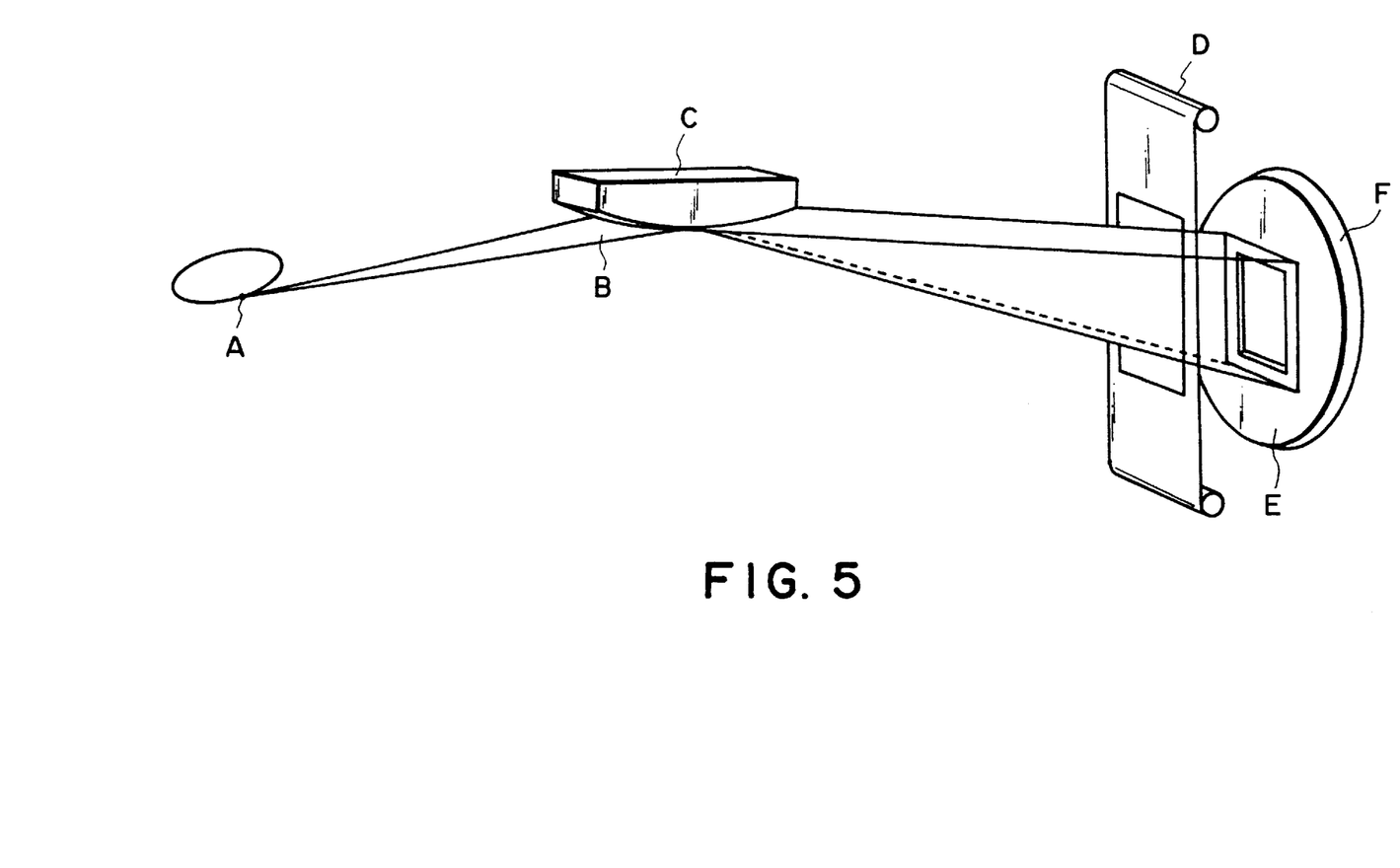
FIG. 5 is a schematic view of an X-ray exposure apparatus according to a seventh embodiment of the present invention.

FIG. 5 is a schematic view of a main portion of an X-ray exposure apparatus of this embodiment. In the apparatus, synchrotron radiation B having a sheet-beam shape, emitted from a synchrotron radiation source A, is expanded by a convex mirror C in a direction perpendicular to the radiation orbital plane. The radiation beam reflectively expanded by the convex mirror C is adjusted by a shutter D so as to provide a uniform exposure amount in the irradiation region. After the shutter D, the radiation beam is directed to an X-ray mask E. The X-ray mask E is the one having been produced in accordance with any one of the first to sixth embodiments- A pattern (exposure pattern) formed on the X-ray mask E is lithographically transferred to a wafer F, through a step-and-repeat process or a scanning process.

In such an X-ray exposure process or X-ray exposure apparatus, since the X-ray blocking layer has been formed very precisely, the step-and-repeat spacing can be reduced and good yield is. assured. Also, high precision X-ray exposure can be accomplished.

[Embodiment 8]

Next, an embodiment of a method of semiconductor device manufacture, using an X-ray mask structure of the present invention, will be explained.

Figure 6:
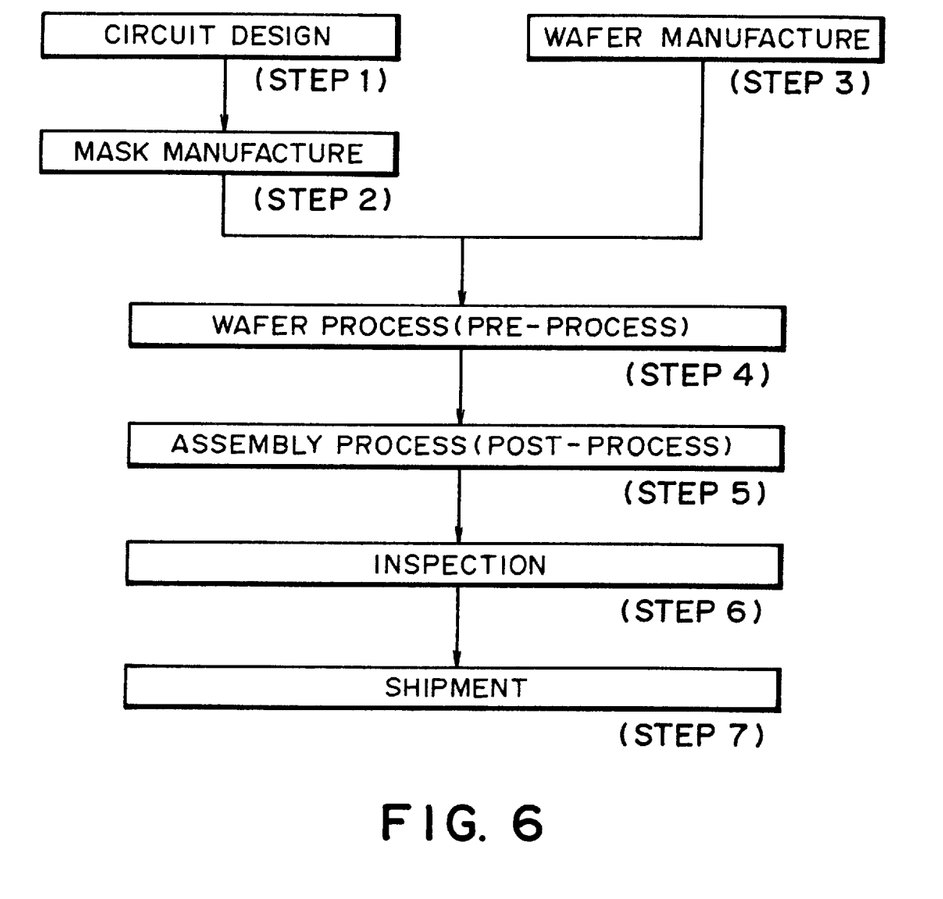
FIG. 6 is a flow chart for explaining semiconductor device manufacturing processes, according to an eighth embodiment of the present invention.

FIG. 6 is a flow chart of the sequence of manufacturing semiconductor devices such as semiconductor chips (e.g. IC's or LSI), liquid crystal panels, CCDs, thin magnetic heads or micro-machines, for example. Step 1 is a design process for designing the circuit of a semiconductor device. Step 2 is a process for manufacturing a mask on the basis of the circuit pattern design, and in accordance with any one of the first to sixth embodiments described above. Step 3 is a process for manufacturing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer processed by step 4 is formed into semiconductor chips. This step includes assembling (dicing and bonding) and packaging (chip sealing). Step 6 is an inspection step wherein an operability check, a durability check and so on of the semiconductor devices produced by step 5 are carried out. With these processes, semiconductor devices are finished and they are shipped (step 7).

Figure 7:
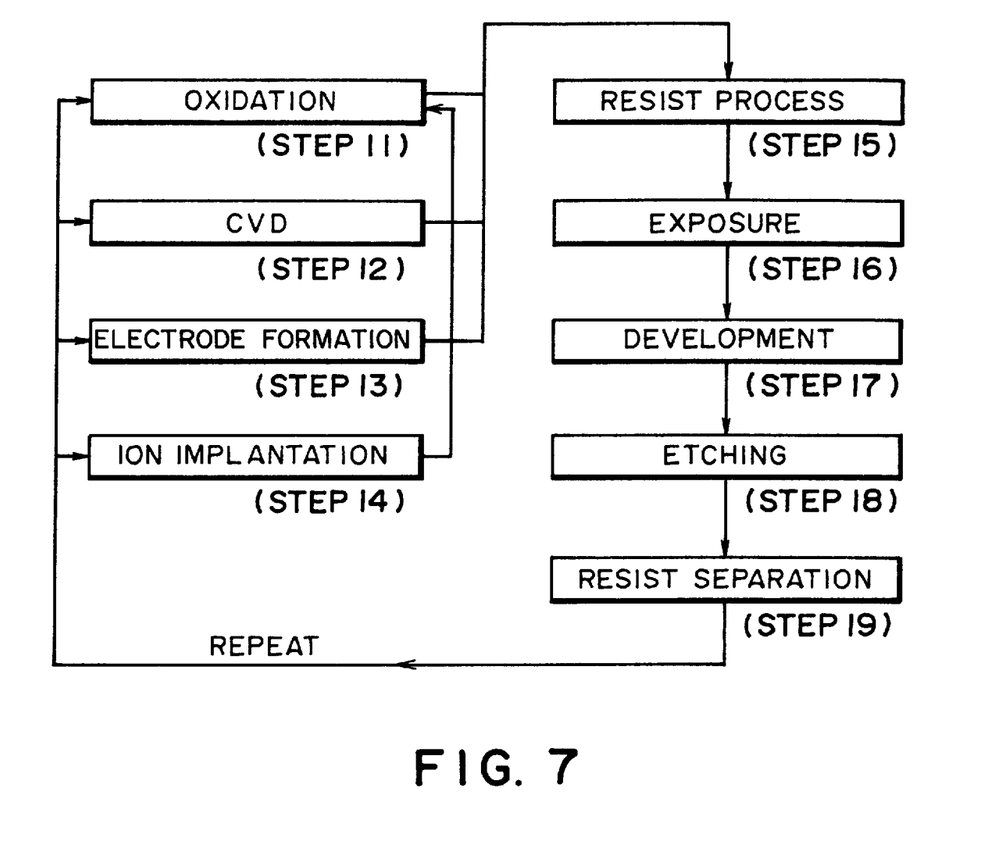
FIG. 7 is a flow chart for explaining details of a wafer process included in the device manufacturing processes of the eighth embodiment.

FIG. 7 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an, ion implanting process for implanting ions to the wafer. Step 15 is a resist process for applying a resist (photosensitive material) to the wafer Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

In accordance with the manufacturing method described above, a high density semiconductor device can be produced. Further, a device produced through X-ray lithography and by using an X-ray mask structure has formed thereon a pattern exactly corresponding to a device design and, therefore, increased device density utilizing the advantage of X-ray lithography is enabled. Also, good device performance is assured.

While the invention has been described with reference to the structures disclosed herein, it is not confined to the details set forth and this application is intended to cover such modifications or changes as may come within the purposes of the improvements or the scope of the following claims.

What is claimed is:

1. An X-ray mask structure produced by a procedure including the following steps:

preparing a substrate having a surface provided thereon with an X-ray transmitting film;

forming, on the substrate, one of a metal film and a multilayered film, having alkali resistivity;

removing a predetermined limited portion of the metal film;

bonding the substrate and a reinforcing member through the remaining metal film, by an anodic bonding process wherein the remaining metal film functions as an electrically conductive material in the anodic bonding process;

etching the substrate with the remaining metal film functioning as an etching mask, to define an X-ray transmitting portion of the X-ray transmitting film; and forming a mask pattern by use of an X-ray absorptive material.

2. A mask structure according to claim 1, wherein the metal film having alkali resistivity contains one of Ti and Ni.

3. A mask structure according to claim 2, wherein the multilayered metal film having alkali resistivity comprises, from a side facing the holding frame, an underlying layer having alkali resistivity and providing adhesion to the holding frame, a metal layer having alkali resistivity, and a metal junction layer having alkali resistivity.

4. A mask structure according to claim 3, wherein the metal junction layer contains one of Ti and Ni.

5. A mask structure according to claim 3, wherein the metal layer contains one of Au, Cu and Pt.

6. A mask structure according to claim 3, wherein the underlying layer contains one of Ti and Cr.

7. An X-ray mask structure according to claim 1, wherein said bonding step comprises bonding the holding frame and the substrate to each other through one of a metal film and a multilayered film, having alkali resistivity, and through an amorphous insulative material containing moving ions.

8. An exposure apparatus, comprising:

holding means for holding an X-ray mask structure as recited in any one of claims 1 through 7; and transfer means for transferring, to a wafer, a pattern formed on the X-ray mask structure held by said holding means.

9. An apparatus according to claim 8, wherein said transfer means transfers the pattern using X-rays.

10. A device manufacturing method including a process for transferring, by using an X-ray mask structure as recited in any one of claims 1 through 7, a pattern formed on the mask structure onto a wafer.

* * * * *

UNITED STATES PATENT AND TRADEMARK OFFICE
CERTIFICATE OF CORRECTION

PATENT NO. : 5,846,676
DATED : December 8, 1998
INVENTOR(S) : KEIKO CHIBA, ET AL.

Page 1 of 3

It is certified that error appears in the above-indentified patent and that said Letters Patent is hereby corrected as shown below:

On The Title Page:

At item [56], under "References Cited", "FOREIGN PATENT DOCUMENTS", "60-186840  9/1995" should read --60-186840  9/1985--.

COLUMN 1:

```
line 17, "an" should read --as an--;
line 27, "an" should read --of an--;
line 30, "finally," should read --Finally,--;
line 39, "performed" should read --performed.--;
line 53, "frame," should read --frame 1,--; and
line 62, "of" should be deleted.
```

COLUMN 2:

```
line 11, "9(a)." should read --9(a)).--;
line 25, "Lo" should read --to--;
line 45, "a,Si" should read --a Si--;
line 46, "example" should read --example,--; and
line 57, "and" (second occurrence) should read --an--.
```

UNITED STATES PATENT AND TRADEMARK OFFICE
CERTIFICATE OF CORRECTION

PATENT NO. : 5,846,676
DATED : December 8, 1998
INVENTOR(S) : KEIKO CHIBA, ET AL.

Page 2 of 3

It is certified that error appears in the above-indentified patent and that said Letters Patent is hereby corrected as shown below:

COLUMN 3:

line 12, "of" (second occurrence) should be deleted;
    line 18, "spacing" (first occurrence) should be deleted;
    line 46, "them" should read --them.--; and
    line 59, "flat s ness" should read --flatness--.

COLUMN 4:

line 47, "uninterruptedly" should read --uninterruptedly.--.

COLUMN 5:

line 43, "inventions" should read --invention,--.

COLUMN 6:

line 33, "1(f)" should read --1(f).--; and
    line 40, "formed." should read --formed--.

COLUMN 7:

line 2, "micron" should read --micron.--;
    line 50, "a niode" should read --anode--; and
    line 58, "comupletion" should read --completion-- and "it" should read --in--.

UNITED STATES PATENT AND TRADEMARK OFFICE
CERTIFICATE OF CORRECTION

PATENT NO. : 5,846,676
DATED : December 8, 1998
INVENTOR(S) : KEIKO CHIBA, ET AL.

It is certified that error appears in the above-indentified patent and that said Letters Patent is hereby corrected as shown below:

COLUMN 8:

line 56, "transmissibility)" should read --transmissivity)--; and
    line 59, "FIGS." should read --FIG.--.

COLUMN 9:

line 65, "embodiments-" should read --embodiments.--.

COLUMN 10:

line 4, "is." should read --is--;
    line 12, "LSI)," should read --LSIs),--; and
    line 38, "wafer" should read --wafer.--.

Signed and Sealed this

Twenty-eighth Day of September, 1999

Attest:

Q. TODD DICKINSON

*Attesting Officer*   *Acting Commissioner of Patents and Trademarks*